(12) United States Patent  (10) Patent No.: US 11,476,180 B2
Nomiyama  (45) Date of Patent: Oct. 18, 2022

(54) SEMICONDUCTOR DEVICE

(71) Applicant: Mitsubishi Electric Corporation, Tokyo (JP)

(72) Inventor: Hiroshi Nomiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/738,615

(22) Filed: Jan. 9, 2020

(65) Prior Publication Data
US 2020/0312743 A1 Oct. 1, 2020

(30) Foreign Application Priority Data

Mar. 26, 2019 (JP) .............................. JP2019-058666

(51) Int. Cl.
H01L 23/40 (2006.01)
H05K 7/20 (2006.01)

(52) U.S. Cl.
CPC ....... H01L 23/4006 (2013.01); H05K 7/2039 (2013.01); H01L 2023/405 (2013.01); H01L 2023/4062 (2013.01)

(58) Field of Classification Search
CPC ......... H01L 23/4006; H01L 2023/4087; H01L 2023/405; H01L 2023/4062; H01L 2224/48137; H01L 2224/48091; H01L 23/36; H01L 23/04; H01L 23/3735; H05K 2201/10409; H05K 1/0203; H05K 3/0061; H05K 7/2039; H05K 7/209
See application file for complete search history.

(56) References Cited

U.S. PATENT DOCUMENTS 2,949,798 A * 8/1960 Berta, Jr. .............. E04F 21/003
                                              408/115 R
4,684,150 A * 8/1987 Specktor ................ B62D 17/00
                                              280/86.753
(Continued)

FOREIGN PATENT DOCUMENTS

DE  102005046404 A1   4/2007
DE  112008000324 T5   12/2009
(Continued)

OTHER PUBLICATIONS

Millbury, Matt; "Bolt Tightening Procedure," (Jan. 10, 2016), retrieved May 27, 2021, https://www.piping-designer.com/index.php/disciplines/mechanical/stationary-equipment/pipe-flanges/102-bolt-tightening-procedure (Year: 2016).*

(Continued)

Primary Examiner — Adam B Dravininkas
(74) Attorney, Agent, or Firm — Studebaker & Brackett PC

(57) ABSTRACT

A semiconductor device according to the present application includes: a current carrying unit having a semiconductor element; a case enclosing the current carrying unit; a heat dissipating plate located on a back side of the current carrying unit and the case; a plurality of thread fastening holes located in at least one of the case and the heat dissipating plate for fastening to an external heat dissipating system; and a plurality of tightening order display structures located near the respective thread fastening holes to display an order in which screws are tightened into the thread fastening holes.

7 Claims, 6 Drawing Sheets

(56) References Cited

U.S. PATENT DOCUMENTS

| | | | | |
|---|---|---|---|---|
| 5,415,418 A | * | 5/1995 | Stimpson | F02F 1/24 277/598 |
| 5,622,378 A | * | 4/1997 | Schlosser | B62D 17/00 280/86.753 |
| 5,806,857 A | * | 9/1998 | Mockenhaupt | F16J 15/0831 277/317 |
| 6,181,006 B1 | * | 1/2001 | Ahl | H01L 23/4006 257/712 |
| 6,531,775 B1 | | 3/2003 | Kobayashi et al. | |
| 6,578,282 B2 | * | 6/2003 | Haegele | F02F 1/24 277/321 |
| 10,438,865 B2 | * | 10/2019 | Taguchi | H01L 23/053 |
| 2003/0094682 A1 | | 5/2003 | Shinohara et al. | |
| 2003/0151130 A1 | * | 8/2003 | Cheon | F28F 3/12 257/712 |
| 2005/0128713 A1 | * | 6/2005 | Schmidberger | H01L 23/4006 361/719 |
| 2007/0090157 A1 | | 4/2007 | Borghoff et al. | |
| 2007/0278669 A1 | * | 12/2007 | Hierholzer | H01L 25/072 257/718 |
| 2008/0178713 A1 | | 7/2008 | Long et al. | |
| 2008/0218975 A1 | * | 9/2008 | Mitsui | H01L 23/4006 361/709 |
| 2009/0135566 A1 | * | 5/2009 | Choi | H05K 7/20963 361/720 |
| 2011/0111649 A1 | * | 5/2011 | Garascia | H01M 50/20 439/890 |
| 2013/0069216 A1 | * | 3/2013 | Miyake | H01L 24/32 257/687 |
| 2014/0124915 A1 | * | 5/2014 | Hayashi | H01L 25/18 257/713 |
| 2015/0001702 A1 | * | 1/2015 | Kawauchi | H01L 23/4334 257/731 |
| 2019/0074238 A1 | | 3/2019 | Okada et al. | |

FOREIGN PATENT DOCUMENTS

| | | |
|---|---|---|
| DE | 102016119854 A1 | 4/2018 |
| DE | 102018214260 A1 | 3/2019 |
| JP | S57-048350 U | 3/1982 |
| JP | 2001-127237 A | 5/2001 |
| JP | 2001-127238 A | 5/2001 |
| JP | 2003-046035 A | 2/2003 |
| JP | 2006-245479 A | 9/2006 |
| WO | 2013/002249 A1 | 1/2013 |

OTHER PUBLICATIONS

Verband der Chemischen Industrie e. V.: Leitfaden zur Montage von Flanschverbindungen in verfahrenstechnischen Anlagen [Guide to the assembly of flange connections in processing plants]. Aug. 2011, Internet.

An Office Action mailed by the German Patent and Trademark Office dated Mar. 31, 2021, which correponds to German Patent Application No. 10 2020 203 542.3 and is related to U.S. Appl. No. 16/738,615.

An Office Action; "Notice of Reasons for Refusal", mailed by the Japanese Patent Office dated Feb. 1, 2022, which corresponds to Japanese Patent Application No. 2019-058666 and is related to U.S. Appl. No. 16/738,615; with English language translation.

An Office mailed by the Japanese Patent Office dated Aug. 16, 2022, which corresponds to Japanese Patent Application No. 2019-058666 and is related to U.S. Appl. No. 16/738,615; with English language translation.

\* cited by examiner

SEMICONDUCTOR DEVICE

BACKGROUND OF THE INVENTION

Field of the Invention

The present application relates to semiconductor devices.

Description of the Background Art

It is important for a semiconductor device, such as a power module for use in an inverter and the like, to efficiently dissipate heat generated by a power chip when energized. In one example of heat dissipating technology, a semiconductor device includes a heat dissipating plate having at least one exposed surface and having high thermal conductivity, and the exposed surface of the heat dissipating plate is brought into contact with an external heat dissipating system, such as a fin, to transfer heat generated by a power chip to the external heat dissipating system through the heat dissipating plate.

In a conventional semiconductor device, for example, a plurality of thread fastening holes are provided in the heat dissipating plate to fasten the heat dissipating plate and the heat dissipating system using screws tightened into the thread fastening holes, so that the heat dissipating plate and the heat dissipating system are brought into contact with each other, and heat generated by the power chip is transferred to the heat dissipating system (e.g., Japanese Patent Application Laid-Open No. 2006-245479).

A person who tightens the screws of the conventional semiconductor device tightens the screws while checking specifications, such as a catalog of the semiconductor device, for an order in which the screws are tightened into the thread fastening holes.

In the conventional semiconductor device as described above, however, the heat dissipating plate and the fin might be thread fastened in the wrong order in a case where the installer misrecognizes the tightening order described in the specifications, such as the catalog of the semiconductor device. Thread fastening in the wrong order might reduce heat dissipation of the semiconductor device as a whole due to insufficient tightening of the screws, for example.

SUMMARY

It is an object of the present invention to provide a semiconductor device that can prevent thread fastening in the wrong order.

A semiconductor device of the present invention includes a current carrying unit, a case, a heat dissipating plate, a plurality of thread fastening holes, and a plurality of tightening order display structures. The current carrying unit has a semiconductor element. The case encloses the current carrying unit. The heat dissipating plate is located on a back side of the current carrying unit and the case. The thread fastening holes are located in at least one of the case and the heat dissipating plate for fastening to an external heat dissipating system. The tightening order display structures are located near the respective thread fastening holes to display an order in which screws are tightened into the thread fastening holes.

According to the semiconductor device disclosed in the present application, the screws can be tightened in the tightening order displayed by the tightening order display structures, so that thread fastening in the wrong order can be prevented.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described below with reference to the drawings. The drawings are schematically shown, and thus sizes and positional relationships can be changed. In description made below, similar or corresponding components bear the same reference signs, and repeated description is omitted in some cases.

In description made below, terms representing specific locations and directions, such as "upper", "lower", "side", "bottom", "front", and "back", may be used. These terms, however, are used for the sake of convenience for ease of understanding of the embodiments, and do not limit directions in actual use.

The embodiments can be combined, or modified or omitted as appropriate.

Embodiment 1

Figure 1:
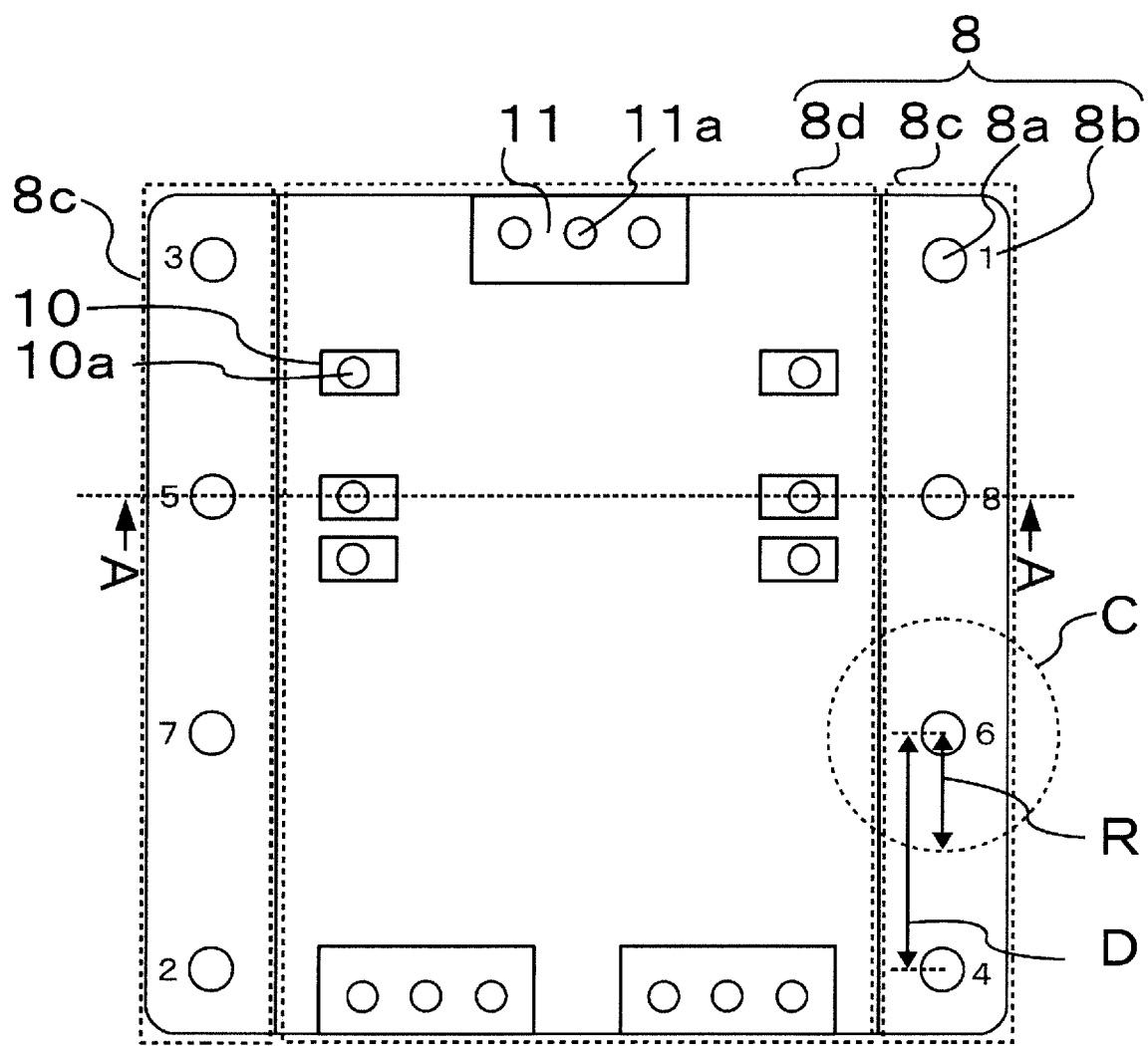
FIG. 1 is a top plan view of a semiconductor device according to Embodiment 1.
Figure 2:
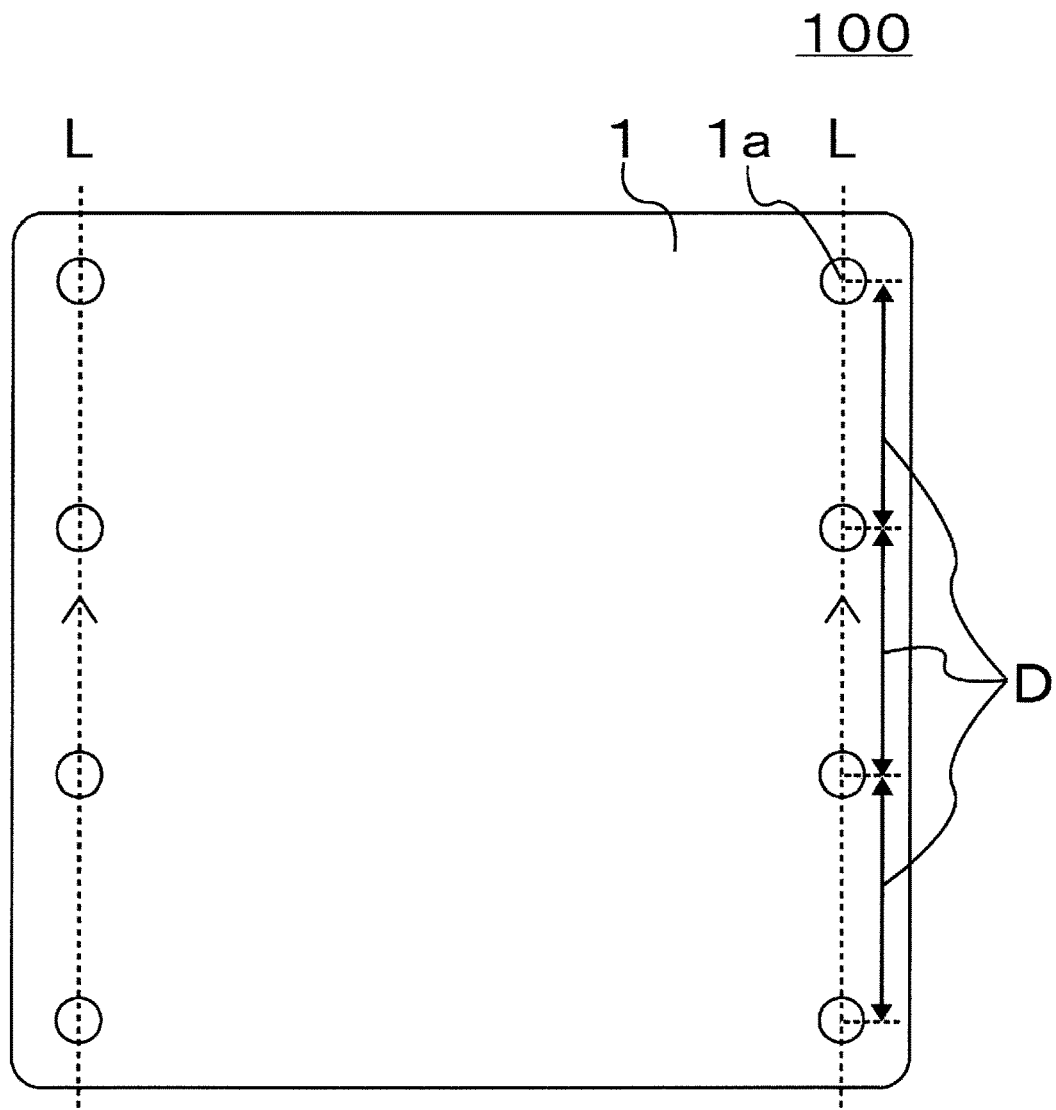
FIG. 2 is a bottom plan view of the semiconductor device according to Embodiment 1.
Figure 3:
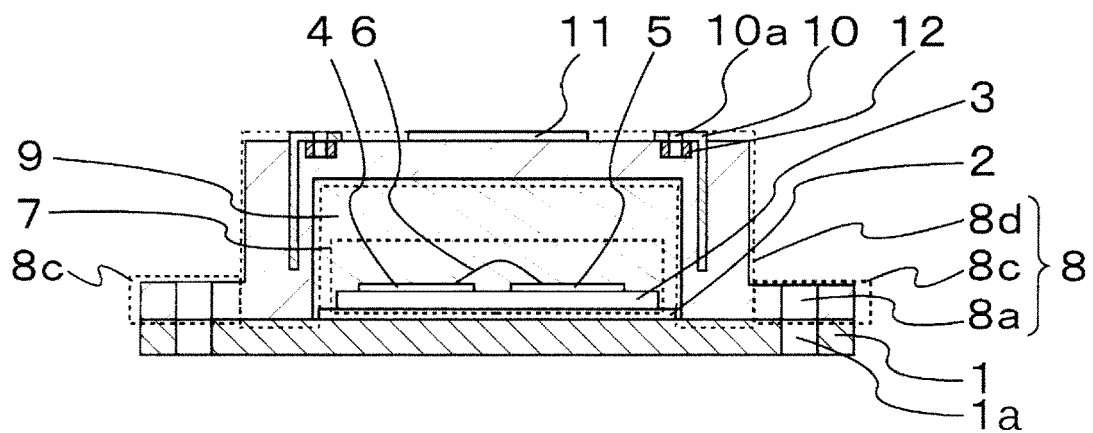
FIG. 3 is a sectional view of the semiconductor device according to Embodiment 1.

A configuration of a semiconductor device 100 according to Embodiment 1 will be described with reference to FIGS. 1, 2, and 3. FIG. 1 is a top plan view of the semiconductor device according to Embodiment 1. FIG. 2 is a bottom plan view of the semiconductor device according to Embodiment 1. FIG. 3 is a sectional view of the semiconductor device according to Embodiment 1. FIG. 3 is the sectional view taken along the line A-A of FIG. 1.

As illustrated in FIG. 2, the semiconductor device 100 includes a heat dissipating plate 1. The heat dissipating plate 1 is formed of copper, ALSINK (Al—SiC), and the like. The heat dissipating plate 1 is rectangular, and has a back surface entirely exposed from the semiconductor device 100. The heat dissipating plate 1 has eight thread fastening holes 1a formed by machining, such as pressing and cutting. The thread fastening holes 1a are arranged, in the heat dissipating plate 1, in two lines parallel to each other. Specifically, the thread fastening holes 1a are arranged in two lines each including four thread fastening holes 1a. Imaginary lines L connecting the centers of the respective four thread fastening holes 1*a* in the two lines are straight lines, and are parallel to each other. The four thread fastening holes 1*a* in each line are arranged at regular intervals with a distance D therebetween.

As illustrated in FIG. 3, an insulating layer 2 formed of an insulator is disposed on a front surface of the heat dissipating plate 1. The heat dissipating plate 1 and the insulating layer 2 are joined together by brazing and the like. An electric circuit pattern 3 including a conductor, such as copper and aluminum, formed in a pattern is disposed on a front surface of the insulating layer 2. The insulating layer 2 and the electric circuit pattern 3 are joined together by brazing and the like. A switching element 4 and a freewheeling element 5 as semiconductor elements are arranged on a front surface of the electric circuit pattern 3, and are jointed to the electric circuit pattern 3 using solder (not illustrated). An insulated-gate bipolar transistor, a metal-oxide-semiconductor field-effect transistor (MOSFET), and the like are used as the switching element 4, and a diode and the like are used as the freewheeling element 5.

The electric circuit pattern 3, the switching element 4, the freewheeling element 5, and a bonding wire 6 constitute a current carrying unit 7. Front surfaces of the switching element 4 and the freewheeling element 5 are electrically connected by the bonding wire 6, and back surfaces of the switching element 4 and the freewheeling element 5 are electrically connected by the electric circuit pattern 3. That is to say, the switching element 4 and the freewheeling element 5 are electrically connected using the bonding wire 6 and the electric circuit pattern 3 as electric wiring to constitute the current carrying unit 7.

A case 8 is disposed to enclose the current carrying unit 7. The case 8 is formed of an insulator, such as a polyphenylene sulfide (PPS) resin. The case 8 is disposed on the front surface of the heat dissipating plate 1, and is fixed to the heat dissipating plate 1 with an adhesive (not illustrated). The case 8 includes thread fastening flat portions 8*c* and a current carrying unit enclosing portion 8*d*. The thread fastening flat portions 8*c* are adjacent to the heat dissipating plate 1. The thread fastening flat portions 8*c* are closer to the back surface of the heat dissipating plate 1 than the current carrying unit enclosing portion 8*d* is. A sealing member 9 having insulating properties is disposed on a side of an inner wall of the case 8. For example, a silicone gel, an epoxy resin, and the like are used for the sealing member 9.

The case 8 is formed by insert molding (integral molding). By insert molding, middle portions of signal electrodes 10 and main electrodes 11 are covered with the case 8 to be integrated, so that the signal electrodes 10 and the main electrodes 11 are fixed to the case 8. The case 8 is disposed between the signal electrodes 10 and the main electrodes 11 to electrically insulate the signal electrodes 10 and the main electrodes 11 from each other. The case, however, is not necessarily required to be formed to integrate the signal electrodes 10 and the main electrodes 11 by insert molding, and may be an outsert case to which the signal electrodes 10 and the main electrodes 11 are fixed by press fitting or thread fastening as needed.

As illustrated in FIG. 3, a middle portion of each of the signal electrodes 10 is covered with the case 8, but one end portion of each of the signal electrodes 10 is exposed from an outer wall of the case 8. The other end portion (not illustrated) of each of the signal electrodes 10 is exposed from the inner wall of the case 8 in another cross section. A middle portion (not illustrated) of each of the main electrodes 11 is covered with the case 8, and one end portion of each of the main electrodes 11 is exposed from the outer wall of the case 8 as illustrated in FIG. 3. The other end portion (not illustrated) of each of the main electrodes 11 is exposed from the inner wall of the case 8 in another cross section.

A nut 12 is disposed under the one end portion of each of the signal electrodes 10, and is fixed to the case 8. Signal electrode holes 10*a* and nuts 12 are concentric with each other in plan view within the margin of a manufacturing error. An external apparatus inputting a control signal can be thread fastened into the signal electrode holes 10*a*. In the other cross section, a nut (not illustrated) is disposed under the one end portion of each of the main electrodes 11, and is fixed to the case 8. Main electrode holes (not illustrated in FIG. 3) and nuts are concentric with each other in plan view within the margin of a manufacturing error. An external system can be thread fastened into the main electrode holes.

The other end portion of each of the signal electrodes 10 is electrically connected to the switching element 4. The other end portion of each of the signal electrodes 10 and the switching element 4 may electrically be connected through solder or a bonding wire. The main electrodes 11 are electrically connected to the current carrying unit 7. By the above-mentioned connection, the control signal is input into the switching element 4 through the signal electrodes 10, the switching element 4 controls carrying of a current of the current carrying unit 7 in accordance with the control signal, and a current flowing through the current carrying unit 7 can be carried to the external system through the main electrodes 11.

As illustrated in FIG. 1, the semiconductor device 100 includes six signal electrodes 10 and three main electrodes 11. Each of the main electrodes 11 has a main electrode hole 11*a* for electrically connecting the external system.

The thread fastening flat portions 8*c* of the case 8 have eight thread fastening holes 8*a* in their front surfaces. The thread fastening flat portions 8*c* are portions provided to facilitate tightening of screws into the thread fastening holes 8*a*, and do not have any protrusion near the center of each of the thread fastening holes 8*a* to facilitate tightening of a screw even if a washer and the like are attached to the screw. Specifically, it is desirable for the thread fastening flat portions 8*c* not to have any protrusion at a location within 10 mm from the center of each of the thread fastening holes 8*a*.

The thread fastening holes 8*a* of the thread fastening flat portions 8*c* and the thread fastening holes 1*a* of the heat dissipating plate 1 are concentric with each other in plan view within the margin of a manufacturing error. The thread fastening holes 8*a* are arranged in two lines in the respective thread fastening flat portions 8*c* on the left and right sides of the case 8, and a line of thread fastening holes 8*a* on the left side of the case 8 and a line of thread fastening holes 8*a* on the right side of the case 8 are parallel to each other. On the front surfaces of the thread fastening flat portions 8*c*, tightening order display structures 8*b* are provided near the eight thread fastening holes 8*a* in one-to-one correspondence with the thread fastening holes 8*a*. The tightening order display structures 8*b* are visible structures, and display an order in which screws are tightened with their shapes. For example, as illustrated in FIG. 1, the tightening order display structures 8*b* display the tightening order with the shapes of Arabic numerals. The eight tightening order display structures 8*b* have different shapes, and display different positions in the order in which the screws are tightened.

The tightening order display structures 8*b* provided on the thread fastening flat portions 8*c* will be described in details. The tightening order display structures 8*b* display the order in which the screws are tightened into the thread fastening holes 8*a* with their different shapes. The tightening order display structures 8b are thus provided near the thread fastening holes 8a in one-to-one correspondence with the thread fastening holes 8a.

As illustrated in FIG. 1, the tightening order display structures 8b are located to be visible from a side of a front surface of the case 8. It is desirable that each of the tightening order display structures 8b be located in a circular region C defined by a radius R from the center of a corresponding one of the thread fastening holes 8a. Locating the tightening order display structure 8b in the circular region C refers not to locating a part of the tightening order display structure 8b in the circular region C but to locating the tightening order display structure 8b as a whole in the circular region C. The length of the radius R is, in a case where any one of the thread fastening holes 8a is selected, one half of a distance from the selected one of the thread fastening holes 8a to another one of the thread fastening holes 8a closest to the selected one of the thread fastening holes 8a.

In the semiconductor device 100 as illustrated in FIG. 1, the distance from the selected one of the thread fastening holes 8a to another one of the thread fastening holes 8a closest to the selected one of the thread fastening holes 8a is the above-mentioned distance D in a case where any one of the thread fastening holes 8a is selected, and thus the radius R is one half of the distance D in a case where any one of the thread fastening holes 8a is selected. When the thread fastening holes 8a are not arranged at regular intervals, it is desirable to adjust a distance from each of the thread fastening holes to a corresponding one of the tightening order display structures so that, in a case where any one of the thread fastening holes is selected, a corresponding one of the tightening order display structures is located in a circular region having a radius that is one half of a distance from the selected one of the thread fastening holes 8a to another one of the thread fastening holes 8a closest to the selected one of the thread fastening holes 8a. Each of the tightening order display structures 8b is located in a region having the radius R, so that misrecognition of correspondence between the tightening order display structures 8b and the thread fastening holes 8a can be prevented.

Figure 4:
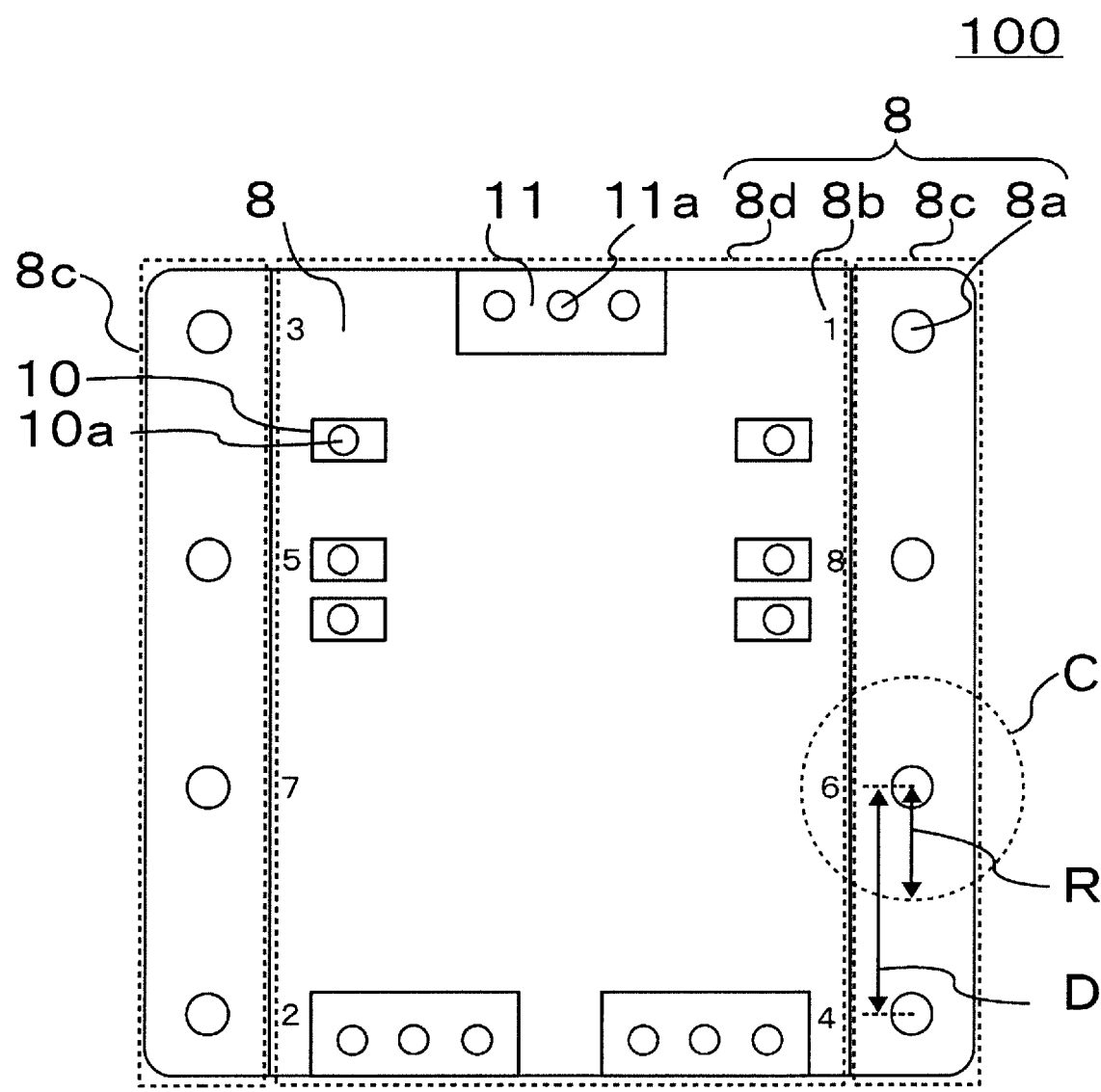
FIG. 4 shows one example of arrangement locations of tightening order display structures.

FIG. 4 shows one example of arrangement locations of the tightening order display structures 8b. As illustrated in FIG. 4, the tightening order display structures 8b may be provided on the current carrying unit enclosing portion 8d as long as each of the tightening order display structures 8b is located in the circular region C. However, visibility of the tightening order display structures 8b increases when the tightening order display structures 8b are provided at an equal level to a portion of the case 8 in which the thread fastening holes 8a are provided. It is thus desirable to provide the tightening order display structures 8b on the thread fastening flat portions 8c in a case where the thread fastening holes 8a are provided in the thread fastening flat portions 8c.

The tightening order display structures 8b display numerals 1 to 8 without any overlaps and omissions. Even-numbered numerals $2n$ (n=1, 2, 3, . . . , ∞) in the order displayed by the tightening order display structures 8b are located diagonally opposite numerals $2n-1$ immediately before the even-numbered numerals $2n$.

The tightening order display structures 8b are recessed structures formed, for example, by the shape of a mold used to form the case or by machining after formation of the case. In a case where the Arabic numerals are used for display, the recessed structures are formed to have the shapes of the numerals corresponding to the respective eight thread fastening holes 8a. In a case where the tightening order display structures 8b are the recessed structures formed by the shape of the mold used to form the case, the tightening order display structures 8b can be formed only by changing the shape of the mold used to form the case 8 once, so that an additional process of forming the tightening order display structures 8b is not required.

Effects of the semiconductor device having such a configuration at installation will be described next. An installer can tighten screws into the thread fastening holes 8a corresponding to the numerals 1 to 8 displayed by the tightening order display structures 8b in order while visually checking the tightening order display structures 8b. Even if the installer misrecognizes a tightening order described in specifications, such as a catalog of the semiconductor device, thread fastening in the wrong order can be prevented by checking the tightening order display structures 8b.

Since the numerals are displayed without any overlaps and omissions, the screws can be tightened into all the thread fastening holes 8a without any omissions by tightening the screws in accordance with the numerals.

Furthermore, since each of the tightening order display structures 8b is located in the circular region C of the case 8, the semiconductor device can be installed without misrecognition of the correspondence between the tightening order display structures 8b and the thread fastening holes 8a.

Since the even-numbered numerals $2n$ are located diagonally opposite the numerals $2n-1$ immediately before the even-numbered numerals, partial fastening (tightening screws only into thread fastening holes 8a in one of the two lines of thread fastening holes 8a arranged in the case 8 first) of the semiconductor device can be prevented. A tilt to one side of the semiconductor device with respect to the surface of the heat dissipating system at installation as illustrated in FIG. 5 caused by partial fastening can also be prevented.

Figure 5:
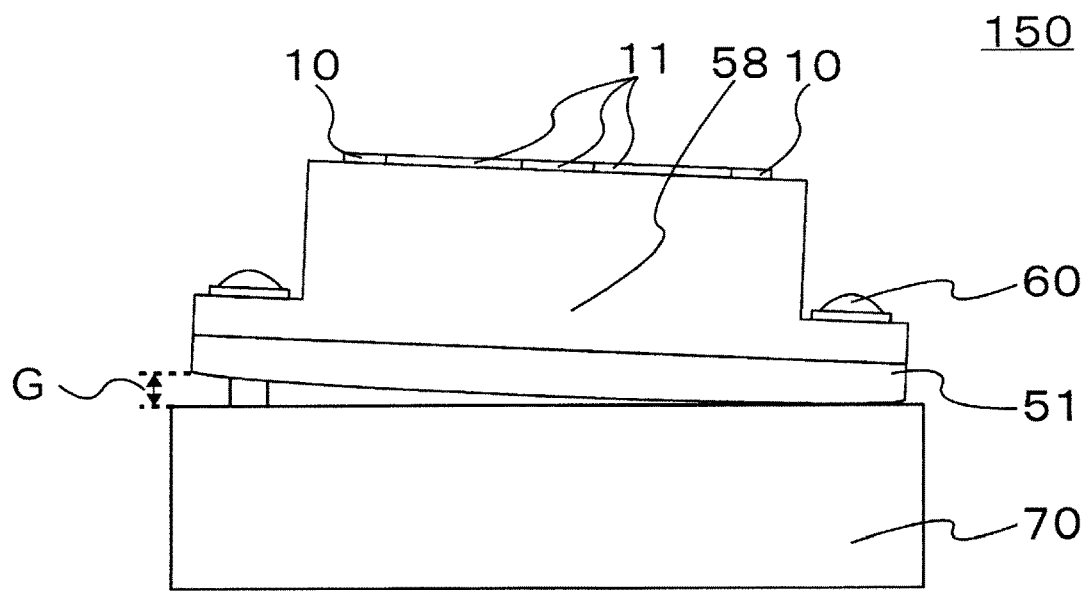
FIG. 5 is a side view of a semiconductor device according to a comparative example fastened in an order causing partial fastening.

FIG. 5 is a side view of a semiconductor device according to a comparative example fastened in an order causing partial fastening. FIG. 5 illustrates a semiconductor device 150 according to the comparative example fastened to a fin 70 using screws 60 as viewed from the side. A case 58 is not provided with the tightening order display structures. A back surface of a heat dissipating plate 51 is convex towards the fin 70. In FIG. 5, a side on which the heat dissipating plate 51 and the fin 70 are in close contact with each other is a side on which screws 60 are tightened first, and a side on which there is a gap G between the heat dissipating plate 51 and the fin 70 is a side on which screws 60 are tightened later. The semiconductor device is installed to tilt to one side with respect to the surface of the heat dissipating system by partial fastening because, at a time point of partial fastening (tightening screws 60 on a side of only one line), a portion of the heat dissipating plate 51 on a side on which screws are tightened later is fixed to be separated from the fin 70, and the gap G remains on the side on which the screws 60 are tightened later even after all the screws including the remaining screws 60 are tightened.

On the other hand, no gap remains in a case where screws are tightened in the order displayed by the tightening order display structures 8b in FIG. 1 compared with a case where partial fastening is performed. This is because a gap is less likely to remain at completion of tightening of all the screws when a correction to reduce the size of the gap is made frequently by tightening, as screws corresponding to even-numbered positions in the order displayed by the tightening order display structures 8b in FIG. 1, screws located diagonally opposite screws corresponding to positions immediately before the even-numbered positions.

There are various main reasons why the semiconductor device is installed to tilt by partial fastening. For example, the semiconductor device is installed to tilt by partial fastening not only in a case where the back surface of the heat dissipating plate is convex but also in a case where the fin is convex towards the heat dissipating plate. The convex shape of the back surface of the heat dissipating plate is intentionally formed to improve heat dissipation at the center of the heat dissipating plate 1, or is unintentionally formed due to variations in warping, a dent made during transfer to an installation site, and the like.

For any reason, however, by providing the tightening order display structures 8b to the case 8, the installer of the semiconductor device can tighten the screws in any correct order in accordance with the display of the tightening order display structures 8b, and thus thread fastening in an unintended order as described above can be prevented. In a case of a product partially fastened intentionally for a reason other than heat dissipation, however, the order displayed by the tightening order display structures 8b may be the order causing partial fastening.

Figure 6:
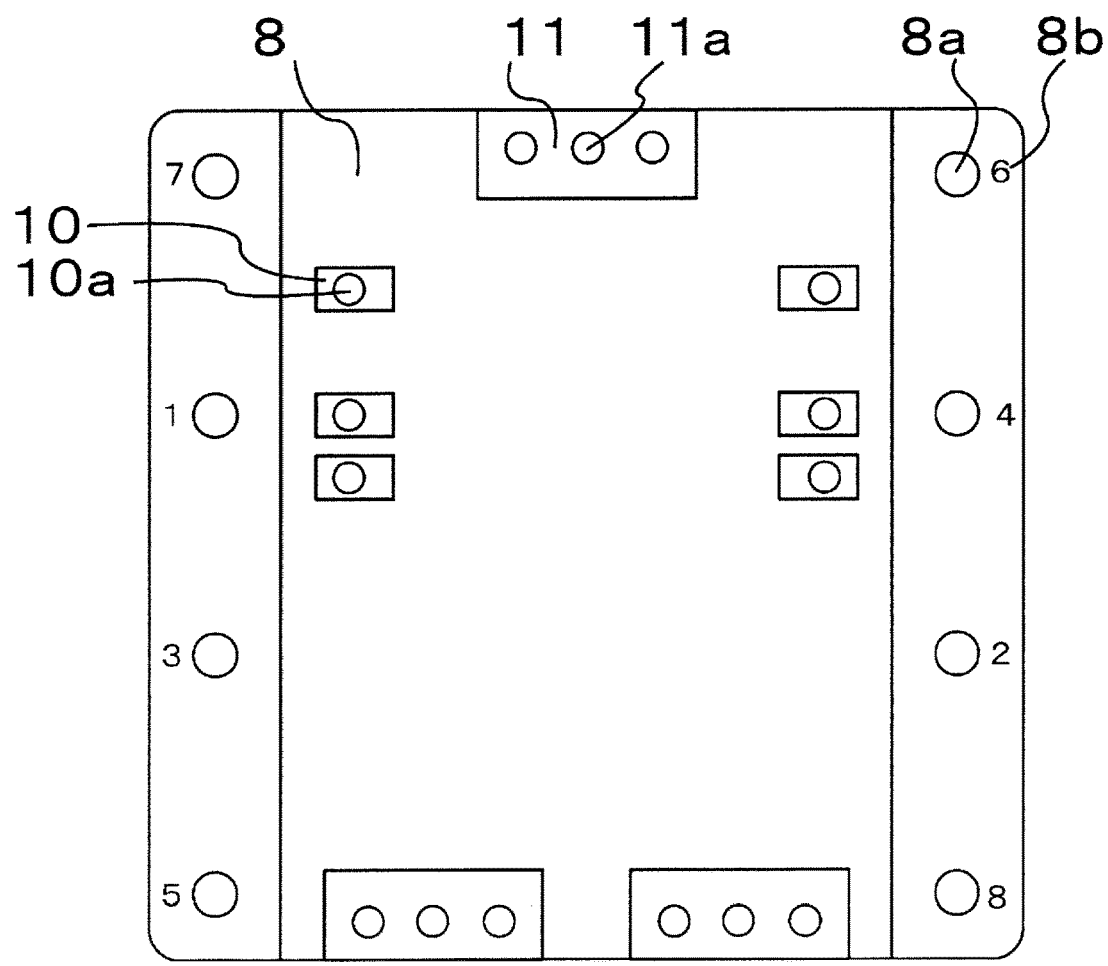
FIG. 6 shows an example of a change in order displayed by the tightening order display structures.

The tightening order display structures 8b of the semiconductor device 100 according to Embodiment 1 of the present application display the Arabic numerals in ascending order from four corners as illustrated in FIG. 1, but the numerical order displayed by the tightening order display structures 8b is not limited to this order. FIG. 6 shows an example of a change in the order displayed by the tightening order display structures. As shown in FIG. 6, for example, if the order displayed by the tightening order display structures 8b is changed so that, in each of the two lines of the thread fastening holes 8a, tightening order display structures 8b at middle locations precede tightening order display structures 8b at lateral locations in the order, a semiconductor device that can prevent thread fastening in the wrong order and can have improved heat dissipation can be obtained.

In a case where the tightening order display structures 8b display the order as illustrated in FIG. 6, heat dissipation of the semiconductor device can be improved, in particular, when semisolid grease is disposed between the heat dissipating plate and the fin. The grease has thermal resistance although a substance having high thermal conductivity is typically selected as the grease, and thus heat dissipation of the semiconductor device can be improved by applying a light coating of a small amount of grease. By tightening the screws in the order displayed by the tightening order display structures 8b as illustrated in FIG. 6, the grease applied at the center of the heat dissipating plate can be gradually transferred to the outside of the heat dissipating plate when the screws are tightened. The amount of grease remaining between the heat dissipating plate and the fin can be reduced by the amount of grease transferred to the outside of the heat dissipating plate, and thus heat dissipation of the semiconductor device can be improved.

The tightening order display structures 8b are not limited to the recessed structures as long as they are visible. For example, the tightening order display structures 8b may be laser printed structures or ink printed structures formed by printing using a laser beam or ink having a different color or gloss from the case 8. The laser beam and the ink are materials typically used for printing of labels displaying model names of products, and thus it is easy to manage a material when the laser beam or the ink is used.

Embodiment 2

Figure 7:
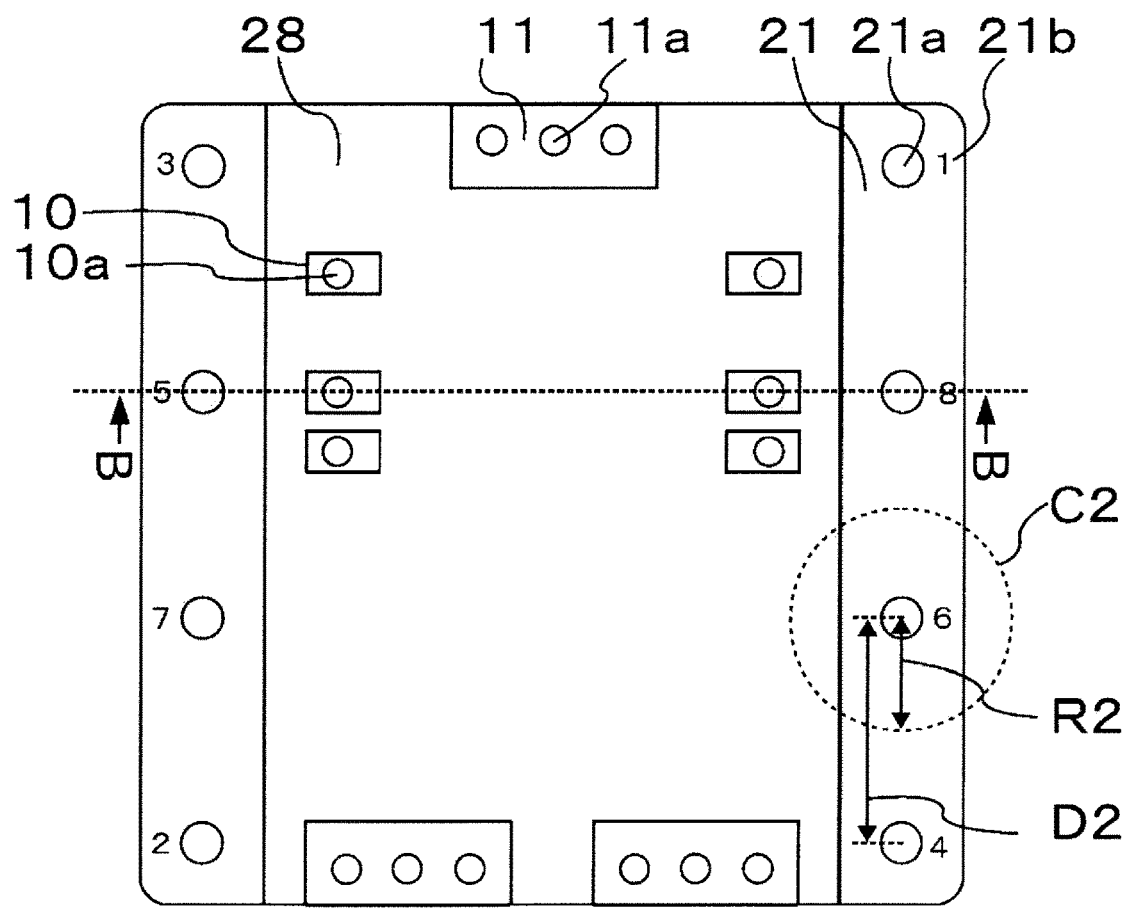
FIG. 7 is a top plan view of a semiconductor device according to Embodiment 2.
Figure 8:
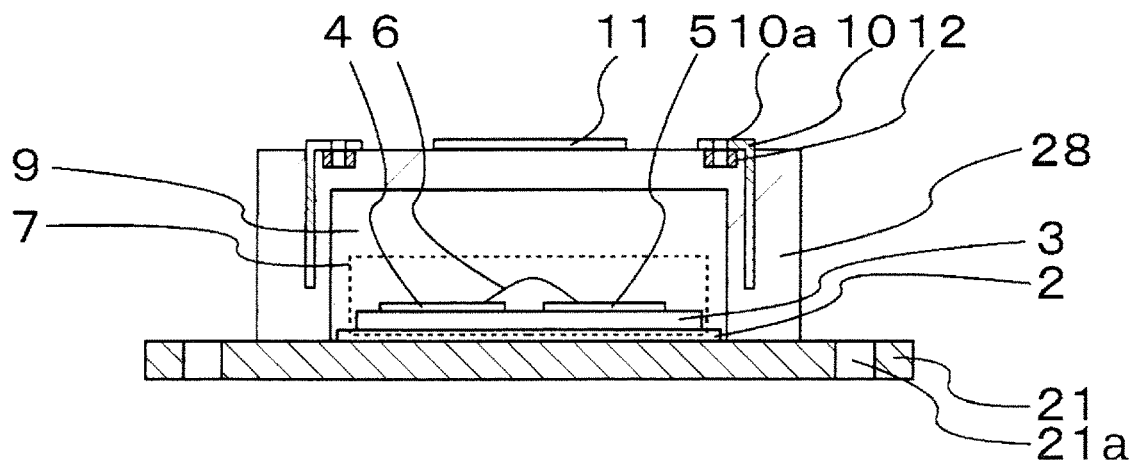
FIG. 8 is a sectional view of the semiconductor device according to Embodiment 2.

A configuration of a semiconductor device 200 according to Embodiment 2 of the present invention will be described with reference to FIGS. 7 and 8. FIG. 7 is a top plan view of the semiconductor device according to Embodiment 2. FIG. 8 is a sectional view of the semiconductor device according to Embodiment 2. FIG. 8 is the sectional view taken along the line B-B of FIG. 7. In Embodiment 2 of the present invention, description of a configuration being the same as or corresponding to that in Embodiment 1 of the present invention will be omitted.

As illustrated in FIG. 8, in the semiconductor device according to Embodiment 2, a case 28 is not disposed on portions of a front surface of a heat dissipating plate 21 around thread fastening holes 21a located in the heat dissipating plate 21. The portions of the front surface of the heat dissipating plate 21 around the thread fastening holes 21a are exposed, and the exposed portions of the front surface of the heat dissipating plate 21 are visible from a side of a front surface of the case 28.

As illustrated in FIG. 7, in the semiconductor device 200 according to Embodiment 2, tightening order display structures 21b are provided on the exposed portions of the front surface of the heat dissipating plate 21. The heat dissipating plate 21 has eight thread fastening holes 21a, and the tightening order display structures 21b are provided in one-to-one correspondence with the thread fastening holes 21a. The tightening order display structures 21b are disposed near the respective thread fastening holes 21a.

The tightening order display structures 21b provided on the heat dissipating plate 21 will be described in details. The tightening order display structures 21b display an order in which screws are tightened into the thread fastening holes 21a with their different shapes. The tightening order display structures 21b are recessed structures formed in the heat dissipating plate 21 by machining, such as pressing and cutting, for example. In a case where the Arabic numerals are used for display, the recessed structures are formed to have the shapes of the numerals corresponding to the respective eight thread fastening holes 21a. In a case where the tightening order display structures 21b are the recessed structures, the tightening order display structures 21b can be formed at the same time as the thread fastening holes 21a formed by machining, so that a process of manufacturing the heat dissipating plate 1 can be simplified.

As illustrated in FIG. 7, the tightening order display structures 21b are located to be visible from the side of the front surface of the case 28. It is desirable that each of the tightening order display structures 21b be located in a circular region C2 defined by a radius R2 from the center of a corresponding one of the thread fastening holes 21a. Locating the tightening order display structure 21b in the circular region C2 refers not to locating a part of the tightening order display structure 21b in the circular region C2 but to locating the tightening order display structure 21b as a whole in the circular region C2. The length of the radius R2 is, in a case where any one of the thread fastening holes 21a is selected, one half of a distance from the selected one of the thread fastening holes 21a to another one of the thread fastening holes 21a closest to the selected one of the thread fastening holes 21a. Each of the tightening order display structures 21b is located in the circular region C2, so that misrecognition of correspondence between the tightening order display structures 21b and the thread fastening holes 21a can be prevented.

Effects of the semiconductor device having such a configuration at installation will be described next. The installer can tighten screws into the thread fastening holes 21a corresponding to the numerals 1 to 8 displayed by the tightening order display structures 21b in order while visually checking the tightening order display structures 21b. Even if the installer misrecognizes the tightening order described in the specifications, such as the catalog of the semiconductor device, thread fastening in the wrong order can be prevented by checking the tightening order display structures 21b.

The tightening order display structures 21b are not limited to the recessed structures as long as they are visible. For example, the tightening order display structures 21b may be resist structures formed by application of a resist having a different color or gloss from the heat dissipating plate 21, or may be plating structures formed by application of plating having a different color or gloss from the heat dissipating plate 21. The resist is a material typically applied to the heat dissipating plate as a mask for preventing adhesion of solder and the plating is a material typically applied to the heat dissipating plate to prevent adhesion of solder, and thus it is easy to manage the materials.

Embodiment 3

Figure 9:
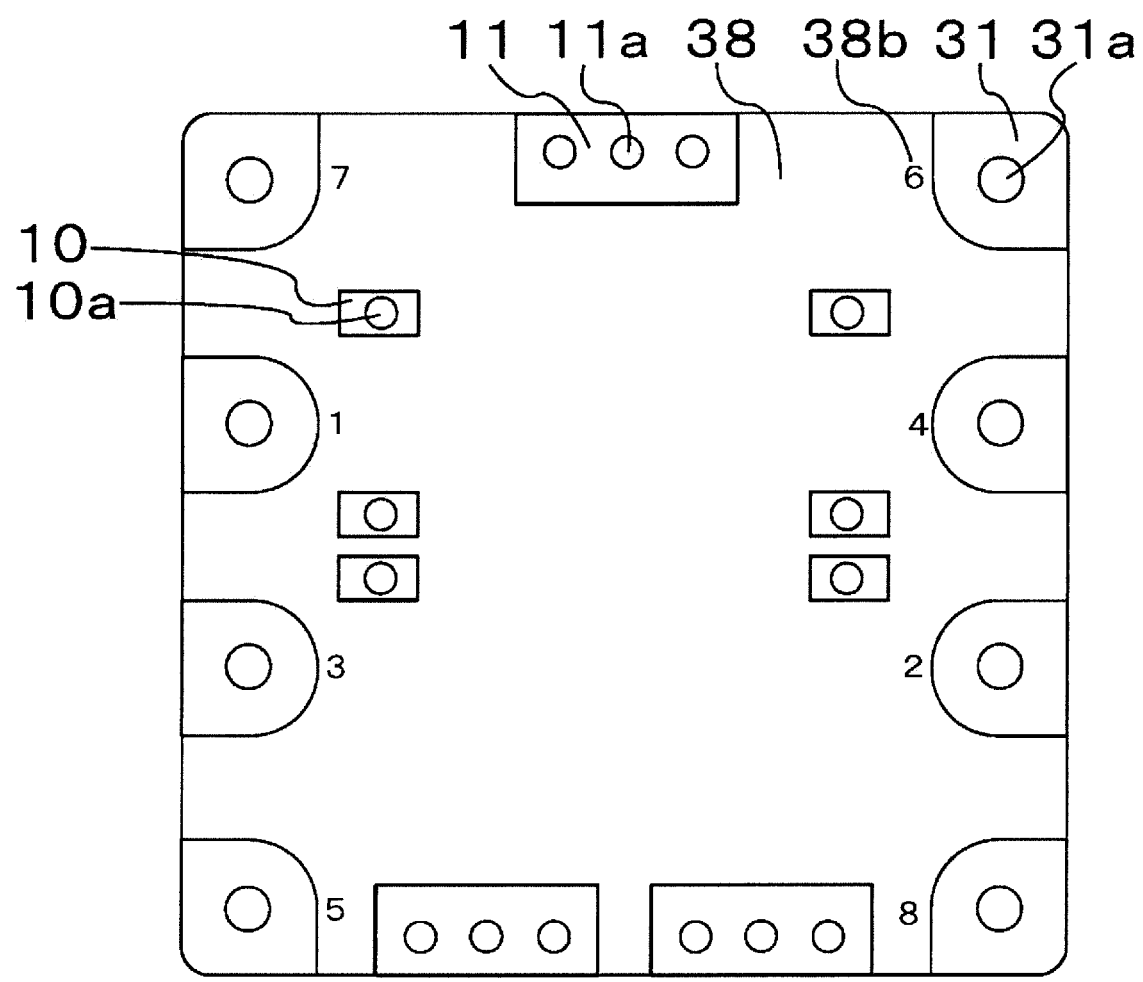
FIG. 9 is a top plan view of a semiconductor device according to Embodiment 3.

A configuration of a semiconductor device 300 according to Embodiment 3 will be described with reference to FIG. 9. FIG. 9 is a top plan view of the semiconductor device according to Embodiment 3. In Embodiment 3 of the present invention, description of a configuration being the same as or corresponding to that in Embodiments 1 and 2 of the present invention will be omitted.

As illustrated in FIG. 9, in the semiconductor device 300 according to Embodiment 3, thread fastening holes 31a are provided in a heat dissipating plate 31, whereas tightening order display structures 38b are provided to a case 38. Portions of a front surface of the heat dissipating plate 31 around the thread fastening holes 31a are exposed, and the exposed portions of the front surface of the heat dissipating plate 31 are visible from a side of a front surface of the case 38. The front surface of the heat dissipating plate 31 has eight exposed portions. The case 38 is disposed between the eight exposed portions of the front surface of the heat dissipating plate 31, and an exposed portion of the front surface of the heat dissipating plate 31 is divided into the eight portions by the case 38. The thread fastening holes 31a are provided in one-to-one correspondence with the eight exposed portions of the front surface of the heat dissipating plate 31.

In Embodiment 3, the thread fastening holes 31a are provided in the heat dissipating plate 31, whereas the tightening order display structures 38b are provided to the case 38. The tightening order display structures can be provided to the case in a case where it is difficult to provide the tightening order display structures to the heat dissipating plate. The design for manufacture of the semiconductor device can be facilitated by providing the thread fastening holes in the heat dissipating plate and providing the tightening order display structures to the case as described above.

Effects of the semiconductor device having such a configuration at installation will be described next. Since the thread fastening holes 31a are provided in one-to-one correspondence with the exposed portions of the front surface of the heat dissipating plate 31, it is easy for the installer to find the thread fastening holes 31a. The tightening order display structures 38b are disposed near the respective thread fastening holes 31a, and the installer can tighten screws into the thread fastening holes 31a corresponding to the numerals 1 to 8 displayed by the tightening order display structures 38b in order while visually checking the tightening order display structures 38b. Even if the installer misrecognizes the tightening order described in the specifications, such as the catalog of the semiconductor device, thread fastening in the wrong order can be prevented by checking the tightening order display structures 38b.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a current carrying unit having a semiconductor element;
   a case enclosing the current carrying unit;
   a heat dissipating plate located on a back side of the current carrying unit and the case;
   a plurality of thread fastening holes located in the heat dissipating plate for fastening to an external heat dissipating system; and
   a plurality of tightening order display structures formed by mold or machining on the heat dissipating plate and located near the respective thread fastening holes to display an order in which screws are tightened into the thread fastening holes, wherein
   a plurality of portions of a front surface of the heat dissipating plate respectively surrounding the plurality of thread fastening holes are exposed and visible from a side of a front surface of the case, and
   the plurality of tightening order display structures are provided on the exposed portions of the front surface of the heat dissipating plate.

2. The semiconductor device according to claim 1, wherein
   each of the tightening order display structures is located within a range having, as a radius, a distance that is one half of a distance from a corresponding one of the thread fastening holes to another one of the thread fastening holes closest to the corresponding one of the thread fastening holes.

3. The semiconductor device according to claim 1, wherein
   the thread fastening holes are located to sandwich the current carrying unit.

4. The semiconductor device according to claim 3, wherein
   the thread fastening holes includes an equal number of thread fastening holes located on one side of the current carrying unit and thread fastening holes located on the other side of the current carrying unit, and
   tightening order display structures displaying even-numbered positions in the order are located diagonally opposite tightening order display structures displaying positions immediately before the even-numbered positions.

5. The semiconductor device according to claim 4, wherein
   on each of one side and the other side of the current carrying unit, tightening order display structures at middle locations precede tightening order display structures at lateral locations in the order.

6. The semiconductor device according to claim 1, wherein
   the thread fastening holes are located only in the heat dissipating plate, and
   the thread fastening holes are visible from a side of a front surface of the case.

7. The semiconductor device according to claim 1, wherein
the tightening order display structures are any of recessed structures, resist structures, and plating structures located on the heat dissipating plate to display the order in which the screws are tightened into the thread fastening holes.

\* \* \* \* \*